(12) United States Patent
Uedaira

(10) Patent No.: US 11,940,533 B2
(45) Date of Patent: Mar. 26, 2024

(54) PROXIMITY SENSOR INCLUDING LIGHT SHIELDING WALLS

(71) Applicant: Rohm Co., Ltd., Kyoto (JP)

(72) Inventor: Yoshitsugu Uedaira, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 609 days.

(21) Appl. No.: 16/556,621

(22) Filed: Aug. 30, 2019

(65) Prior Publication Data
US 2020/0081122 A1    Mar. 12, 2020

(30) Foreign Application Priority Data
Sep. 11, 2018 (JP) .................................. 2018169778

(51) Int. Cl.
*G01S 17/04* (2020.01)
*G01S 7/481* (2006.01)
(Continued)

(52) U.S. Cl.
CPC ............ *G01S 17/04* (2020.01); *G01S 7/4813* (2013.01); *G01S 7/4816* (2013.01);
(Continued)

(58) Field of Classification Search
CPC ........ G01S 17/04; G01S 7/4865; G01S 17/06; G01S 7/4813; G01S 7/4816; G01S 7/497;
(Continued)

(56) References Cited

U.S. PATENT DOCUMENTS 7,604,981 B1 * 10/2009 Harris, Jr. .......... G01N 21/6454
435/7.1
8,716,722 B2 * 5/2014 Peng .................... H01L 31/0203
257/E31.115
(Continued)

FOREIGN PATENT DOCUMENTS

CN        103515372       1/2014
EP         3193192         7/2017
(Continued)

OTHER PUBLICATIONS

JP Office Action in Japanese Appln. No. 2018-169778, dated May 17, 2022, 10 pages (with English Translation).
(Continued)

*Primary Examiner* — Jennifer D Bennett
*Assistant Examiner* — Erin R Garber
(74) *Attorney, Agent, or Firm* — Fish & Richardson P.C.

(57) ABSTRACT

The present disclosure relates to a proximity sensor. The proximity sensor includes: a light emitter (for example, a vertical cavity surface emitting LASER (VCSEL)) configured to irradiate light to a target to be inspected; a first light receiver having a first crosstalk characteristic, configured to detect an external reflected light from a target to be inspected within a first detection region (for example, 0~5 cm approximately); and a second light receiver having a second crosstalk characteristic different from the first crosstalk characteristic, configured to detect an external reflected light from a target to be inspected within a second detection region (for
(Continued)

example, 3~60 cm approximately) relatively further than the first detection region.

18 Claims, 8 Drawing Sheets

(51) Int. Cl.
  *G01S 7/4865* (2020.01)
  *G01S 7/497* (2006.01)
  *G01S 17/06* (2006.01)
  *H01S 5/023* (2021.01)
  *H01S 5/0233* (2021.01)
  *H01S 5/0683* (2006.01)
  *H01S 5/183* (2006.01)
  *H01S 5/02257* (2021.01)
  *H01S 5/0235* (2021.01)

(52) U.S. Cl.
  CPC ............ *G01S 7/4865* (2013.01); *G01S 7/497* (2013.01); *G01S 17/06* (2013.01); *H01S 5/023* (2021.01); *H01S 5/0233* (2021.01); *H01S 5/0683* (2013.01); *H01S 5/02257* (2021.01); *H01S 5/0235* (2021.01); *H01S 5/183* (2013.01)

(58) Field of Classification Search
  CPC ...... G01S 7/4808; G01S 17/08; G01S 7/4972; G01S 17/48; H01S 5/183; H01S 5/02325; H01S 5/02257; H01S 5/023; H01S 5/0233; H01S 5/0235; H01S 2301/02; H01S 5/0683; H01S 5/423; H01S 5/022; G02B 19/0085; G02B 26/10; G02B 19/0052

See application file for complete search history.

(56) References Cited

U.S. PATENT DOCUMENTS

| | | | |
|---|---|---|---|
| 10,481,670 B2 * | 11/2019 | Hsu | .................. G06F 3/0304 |
| 10,705,211 B2 * | 7/2020 | Jacobs | .................. G01S 7/4813 |
| 2011/0248152 A1 * | 10/2011 | Svajda | .................. G01S 11/12 |
| | | | 250/221 |
| 2014/0124647 A1 | 5/2014 | Hsu | |
| 2015/0378013 A1 | 12/2015 | Bikumandla et al. | |
| 2016/0146938 A1 | 5/2016 | Becker et al. | |
| 2017/0168144 A1 * | 6/2017 | Gimpel | .................. G01S 7/4817 |
| 2017/0284864 A1 | 10/2017 | Chen | |
| 2018/0164409 A1 * | 6/2018 | Chen | .................. G01J 1/0271 |
| 2019/0187254 A1 * | 6/2019 | Kappel | .................. G01S 17/08 |
| 2019/0361093 A1 * | 11/2019 | Gani | .................. G01J 1/4204 |

FOREIGN PATENT DOCUMENTS

| | | | |
|---|---|---|---|
| JP | H05-107054 | 4/1993 | |
| JP | H06-241788 | 9/1994 | |
| JP | H07-301522 | 11/1995 | |
| JP | 2007121116 A * | 5/2007 | ............ G01S 17/36 |
| JP | 2010-286235 | 12/2010 | |
| JP | 2015-078947 | 4/2015 | |
| JP | 2017-005428 | 1/2017 | |
| WO | WO 2017/094279 | 6/2017 | |

OTHER PUBLICATIONS

JP Search Report in Japanese Appln. No. 2018-169778, dated Apr. 20, 2022, 44 pages (with English Translation).
CN Office Action in Chinese Appln. No. 201910733673.0, dated Dec. 19, 2022, 12 pages (with English Summary).
The State Intellectual Property Office of People's Republic of China, Office Action in Chinese Appln. No. 201910733673.0, dated May 11, 2023, 11 pages (with English translation summary).
The State Intellectual Property Office of People's Republic of China, Office Action in Chinese Appln. No. 20190733673.0, dated Oct. 10, 2023, 10 pages (with English Summary).

* cited by examiner

PROXIMITY SENSOR INCLUDING LIGHT SHIELDING WALLS

BACKGROUND OF THE INVENTION

Field of the Invention

The present disclosure relates to an optical proximity sensor.

Description of the Prior Art

An optical proximity sensor emits infrared toward the outside of a device (smartphone et cetera) carrying the optical proximity sensor and detects a reflected light returning from the outside of the device so as to detect whether a target to be inspected is approaching (equivalent to whether a light reflects off the target to be inspected).

Furthermore, citation document 1 is hereby cited to serve as an example of the prior art.

DOCUMENT RELATED TO PRIOR ART

Citation Document

[Citation Document 1] US 2015/0378013

SUMMARY OF THE INVENTION

Problem Addressed by Present Disclosure

However, conventional proximity sensors are not effective in performing both near proximity sensing (0~5 cm approximately) and far proximity sensing (3~60 cm approximately).

To address the aforesaid problem, the present disclosure provides a proximity sensor for both near proximity sensing and far (or mid- to far-) proximity sensing.

Technical Solution to the Problem

The proximity sensor of the present disclosure comprises the 1st technical feature as follows: a light emitter configured to irradiate light to a target to be inspected; a first light receiver having a first crosstalk characteristic, configured to detect an external reflected light from a target to be inspected within a first detection region; and a second light receiver having a second crosstalk characteristic different from the first crosstalk characteristic, configured to detect an external reflected light from a target to be inspected within a second detection region relatively further than the first detection distance.

Furthermore, the proximity sensor which has the 1st technical feature further comprises a first light shielding wall (the 2nd technical feature). The first light shielding wall shields an internal reflected light and an internal leaked light toward the second light receiver.

The proximity sensor which has the 1st or 2nd technical feature further comprises a second light shielding wall (the 3rd technical feature). The second light shielding wall reduces an internal reflected light and an internal leaked light toward the first light receiver.

Regarding the proximity sensor which has any one of the 1st~3rd technical features, the distance between the second light receiver and the transmissive window is greater than the distance between the first light receiver and the transmissive window (the 4th technical feature).

Regarding the proximity sensor which has any one of the 1st~4th technical features, the distance between the second light receiver and the light emitter is greater than the distance between the first light receiver and the light emitter (the 5th technical feature).

Regarding the proximity sensor which has any one of the 1st~5th technical features, the light emitter is a vertical cavity surface emitting LASER (VCSEL) (the 6th technical feature).

Regarding the proximity sensor which has any one of the 1st~6th technical features, the output accumulation time of the second light receiver is longer than the output accumulation time of the first light receiver (the 7th technical feature).

Regarding the proximity sensor which has any one of the 1st~7th technical features, the number of times of output accumulation of the second light receiver is greater than the number of times of output accumulation of the first light receiver (the 8th technical feature).

Regarding the proximity sensor which has any one of the 1st~8th technical features, the proximity sensor detects whether a target to be inspected exists within the second detection region by time-of-flight (TOF) method (the 9th technical feature).

Regarding the proximity sensor which has any one of the 1st~9th technical features, the light emitter, the first light receiver, and the second light receiver are respectively formed on different chips individually (the 10th technical feature).

Regarding the proximity sensor which has any one of the 1st~9th technical features, the light emitter and the first light receiver are formed on the same chip (the 11th technical feature).

Regarding the proximity sensor which has any one of the 1st~9th technical features, the first light receiver and the second light receiver are formed on the same chip (the 12th technical feature).

Regarding the proximity sensor which has any one of the 1st~9th technical features, the light emitter, the first light receiver, and the second light receiver are formed on the same chip (the 13th technical feature).

Regarding the proximity sensor which has any one of the 1st~13rd technical features, the first detection region is in a range from 0 cm to 5 cm and the second detection region is in a range from 3 cm to 60 cm (the 14th technical feature).

Regarding the proximity sensor which has the 2th technical feature, the first light shielding wall is disposed at a position above the upper surface of the first light receiver (as recited in the $15^{th}$ technical feature).

Regarding the proximity sensor which has any one of the 1st~15th technical features, the second light receiver is disposed at a position below the lower surface of the first light receiver (the 16th technical feature).

Regarding the proximity sensor which has the 2nd or 15th technical feature, the second light receiver is disposed at a position below the lower surface of the first light shielding wall (the 17th technical feature).

Regarding the proximity sensor which has the 17th technical feature, the lower surface of the first light shielding wall is in contact with an upper surface of a chip with the second light receiver disposed thereon (the 18th technical feature).

Regarding the proximity sensor which has the 18th technical feature, a chip with the first light receiver formed thereon, a structural member with the first light shielding wall formed thereon, and the chip with the second light receiver disposed thereon vertically overlaps from a cross-sectional view (the 19th technical feature).

Regarding the proximity sensor which has the 18th or 19th technical feature, a chip with the light emitter formed thereon, a structural member with the first light shielding wall formed thereon, and the chip with the second light receiver disposed thereon vertically overlaps from a cross-sectional view (the 20th technical feature).

Regarding the proximity sensor which has any one of the 1st~20th technical features, a distance d1 is between the light emitter and an edge of the first light receiver on a side proximal to the light emitter, a distance d2 is between the light emitter and an edge of the second light receiver on a side proximal to the light emitter, wherein a ratio d2/d1 is greater than 3 (the 21st technical feature).

Regarding the proximity sensor which has any one of the 1st~21st technical features, a distance d1' is between the light emitter and an edge of the first light receiver on a side opposite to the light emitter, a distance d2' is between the light emitter and an edge of the second light receiver on a side opposite to the light emitter, wherein a ratio d2'/d1' is less than 12 (the 22nd technical feature).

The present disclosure further provides an electronic device comprising the 23rd technical feature as follows: the proximity sensor which has any one of the 1st~22nd technical features; and a casing comprising a transmissive window facing the proximity sensor.

Advantage of Present Disclosure

The present disclosure provides a proximity sensor for both near proximity sensing and far proximity sensing.

DETAILED DESCRIPTION OF THE EMBODIMENTS

First Embodiment

Figure 1:
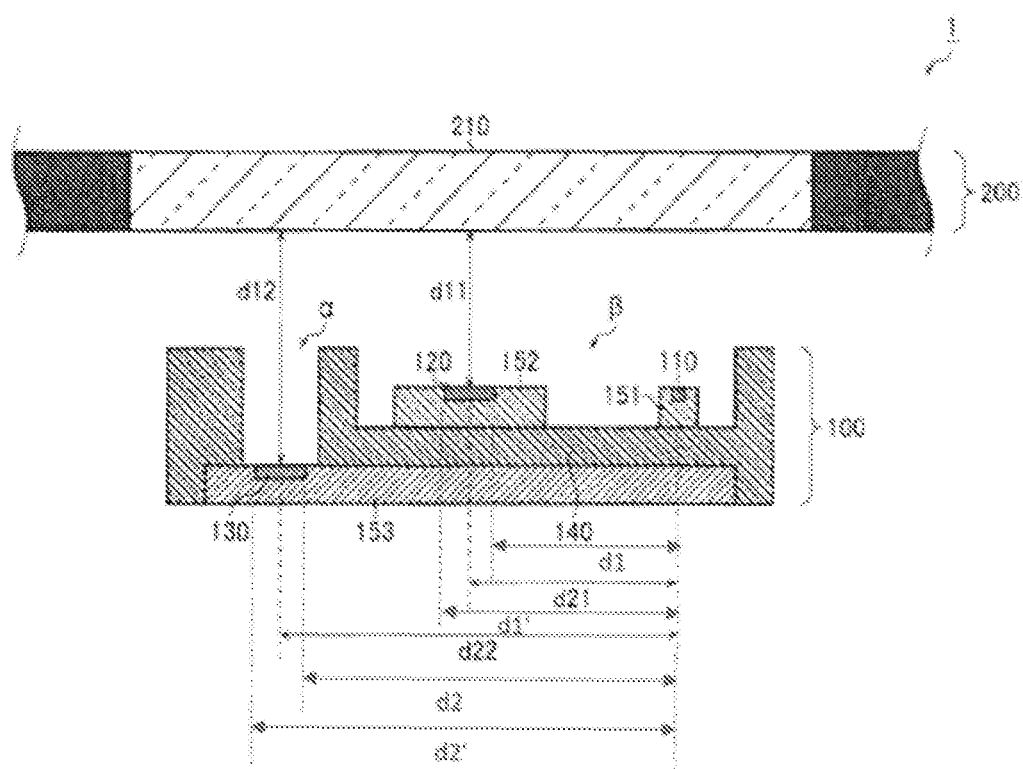
FIG. 1 is a schematic view of an electronic device carrying a proximity sensor according to the first embodiment of the present disclosure.

FIG. 1 is a cross-sectional view of an electronic device 1 carrying a proximity sensor according to the first embodiment of the present disclosure. The electronic device 1 has an optical proximity sensor 100 and a casing 200 carrying the proximity sensor 100. The casing 200 comprises a transmissive window 210 facing the proximity sensor 100.

Furthermore, the electronic device 1 can be a smartphone in some examples (as the details will be described subsequently).

The proximity sensor 100 is a module which emits light toward the outside of the electronic device 1 carrying the proximity sensor 100 and detects a reflected light returning from the outside of the electronic device 1 so as to detect whether a target to be inspected is approaching (equivalent to whether a light reflects off the target to be inspected) and comprises a light emitter 110, a first light receiver 120, a second light receiver 130 and a structural member 140.

Furthermore, the light emitter 110, first light receiver 120, and second light receiver 130 are respectively integrated into individual chips 151~153.

The light emitter 110 is a light-emitting component which emits light (for example, infrared with wavelength of 650~1300 nm) toward the outside of the electronic device 1 and is integrated into the chip 151. The light emitter 110, for example, is a Vertical Cavity Surface Emitting LASER (VCSEL).

The VCSEL has a smaller emitting angle (5~20° relative to the vertical direction of substrate) than light-emitting diodes. Therefore, if the VCSEL is used as the light emitter 110, crosstalk caused by internal leaked light propagating inside the proximity sensor 100 is no cause for concern. Therefore, it is feasible to reduce the distance d21 between the light emitter 110 and first light receiver 120, and reduce the distance d22 between the light emitter 110 and second light receiver 120. Hence, it is feasible to reduce the diameter of the transmissive window 210. Therefore, the designability of the electronic device 1 is enhanced. Furthermore, no converging element for converging the light emitted from the light emitter 110 is required.

However, the light emitter 110 is not limited to a VCSEL, and the light emitter 110 can be a Vertical External Cavity Surface Emitting Laser (VECSEL) which has an external resonator, an Edge Emitting Laser (EEL) which emits light from a cleavage, or a light-emitting diode (LED).

The first light receiver 120 detects whether a target to be inspected exists within a first detection region (for example, 0~5 cm approximately), is used in near proximity sensing (NPS), and is integrated into the chip 152.

The second light receiver 130 detects whether the target to be inspected exists within a second detection region relatively further than the first detection region (for example, 3~60 cm approximately), is used in far proximity sensing (FPS), and is integrated into the chip 153.

Furthermore, the first light receiver 120 and second light receiver 130 are respectively photoelectrical diode or photoelectrical transistor which demonstrates peak sensitivity to the wavelength of the light emitted from the light emitter 110 and outputs current signals according to the intensity to the light received. Furthermore, preferably, signal processing circuits (not shown in the diagram), for example current amplifier, filter, or AD converter, are integrated into the chips 152, 153, respectively.

The structural member 140 is the body (frame) of the proximity sensor 100 and is, for example, made of glass epoxy such as hard resin or ceramic.

Furthermore, except the trap-type light guide zone α from the transmissive window 210 to the second light receiver 130, the surface as well as the side surfaces of the chip 153 integrated with second light receiver 130 are covered by the structural member 140.

Furthermore, grid shape (recessed) chip mounted zone β is formed on the surface side (i.e., the side which the transmissive window 210 faces) of the structural member 140 on the chip 153. Furthermore, the chip 151 which the light emitter 110 is integrated into and the chip 152 which the first light receiver 120 is integrated into are arranged side by side and disposed in chip mounted zone β.

Furthermore, trap-type light guide zone a and chip mounted zone β are hermetically sealed with transparent resin element (not shown in the diagram), for example, epoxy, silicone resin, silicone-modified epoxy, polyamide, acrylate resin, and urea.

As previously discussed, the proximity sensor 100 in this embodiment takes on a multi-segment structure (vertically stacked structure), that is, with the light emitter 110 and first light receiver 120 being above the second light receiver 130. Hence, the distance d12 between the second light receiver 130 and the transmissive window 210 becomes greater than the distance d11 between the first light receiver 120 and the transmissive window 210.

Furthermore, from a horizontal perspective (i.e., the horizontal direction in the diagram), the light emitter 110, first light receiver 120, and second light receiver 130 are arranged in a right-to-left order as shown in the diagram. Therefore, the distance d22 between the second light receiver 130 and the light emitter 110 becomes greater than the distance d21 between the first light receiver 120 and the light emitter 110.

The purpose of the aforesaid component structure is to optimize the crosstalk characteristic of the first light receiver 120 for use in near proximity sensing and the crosstalk characteristic of the second light receiver 130 for use in far proximity sensing.

The ways of performing near proximity sensing and far proximity sensing (hereinafter, can also be referred to as mid- to far-proximity sensing) with the proximity sensor 100 are illustrated by the accompanying drawings and described below.

Near Proximity Sensing (NPS)

Figure 2:
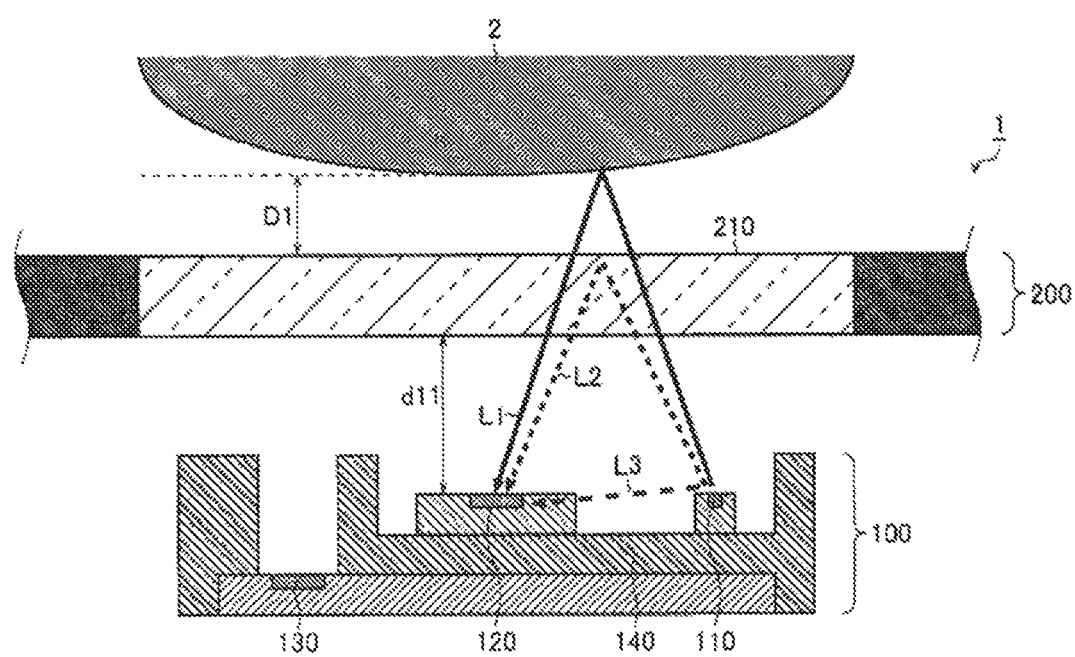
FIG. 2 is a schematic view of an example of near proximity sensing.

FIG. 2 is a schematic view of an example of near proximity sensing performed with the proximity sensor 100. When a target 2 to be inspected exists within a first detection region D1 (for example, 0 cm≤D1≤5 cm) from the transmissive window 210, the light emitted from the light emitter 110 and reflected by the target 2 to be inspected is defined as an external reflected light L1 and detected by the first light receiver 120. If the target 2 to be inspected does not exist within the first detection region D1, the first light receiver 120 cannot detect the external reflected light L1. Therefore, near proximity sensing of the target 2 to be inspected can be performed according to whether the first light receiver 120 detects the external reflected light L1.

However, crosstalk occurs to the proximity sensor 100 may be mainly due to an internal reflected light L2 returning from the transmissive window 210, and an internal leaked light L3 propagating inside the proximity sensor 100.

Furthermore, the crosstalk caused by the internal leaked light L3 can be substantially reduced to approximately 0 (substantially eliminated) with utilizing the VCSEL, by adjusting the distance between light reception and light emission, and/or incorporating the light shielding walls.

Furthermore, the crosstalk caused by the internal reflected light L2 can be substantially reduced to approximately 0 (substantially eliminated) with incorporating the light shielding walls or by adjusting the distance d11 between the first light receiver 120 and the transmissive window 210. However, it should be noted that in some embodiments, in order to accurately detect whether an object which does not effectively reflect infrared is approaching, the crosstalk is not reduced to approximately 0 (not substantially eliminated).

For example, regarding the first light receiver 120, to accurately detect black hair attached to the transmissive window 210 (known as "black hair 0 cm proximity"), it is necessary that the crosstalk caused by the internal reflected light L2 may not be substantially eliminated, thereby detecting the external reflected light L1 in the presence of a trace of the crosstalk (that is, a slight light reception increase results from detection of black hair 0 cm proximity, as a certain level of the received light is detected under the influence of the crosstalk in case of non-proximity.)

Far Proximity Sensing (FPS)

Figure 3:
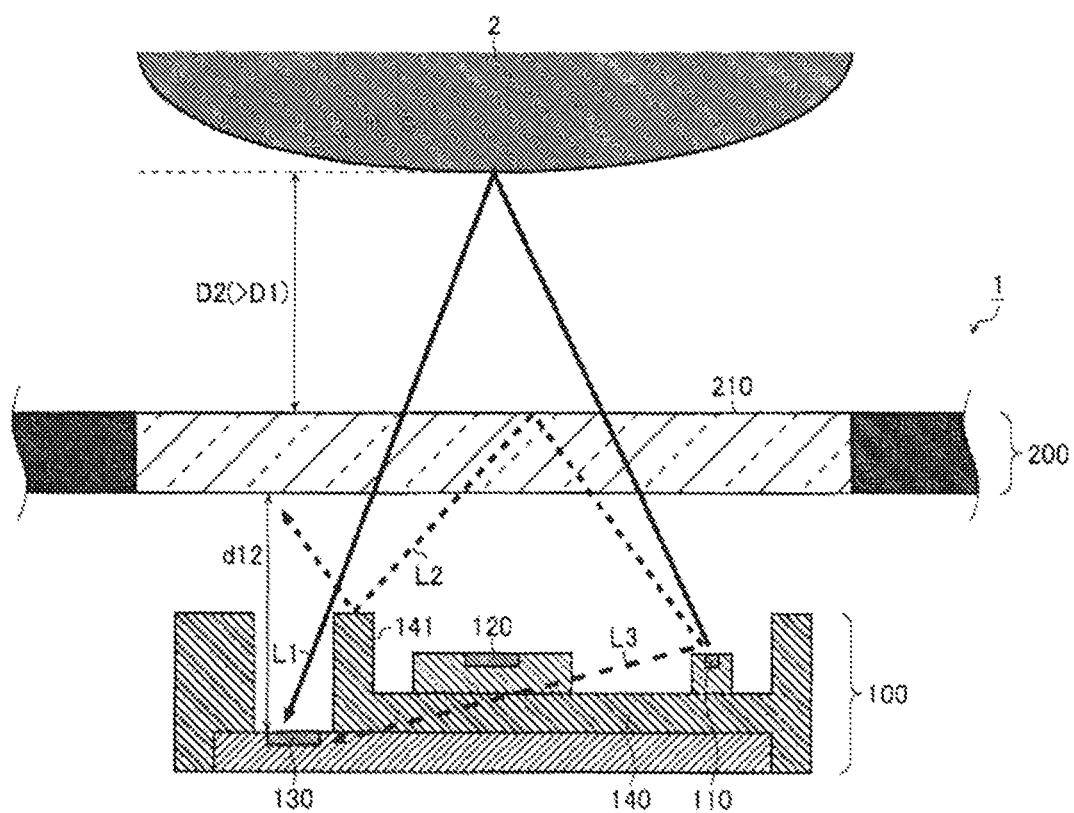
FIG. 3 is a schematic view of an example of far proximity sensing.

FIG. 3 is a schematic view of an example of far proximity sensing performed with the proximity sensor 100. When the target 2 to be inspected exists within a second detection region D2 (for example, 3 cm≤D2≤60 cm) relatively further than the first detection region D1 from the transmissive window 210, wherein the light emitted from the light emitter 110 and reflected by the target 2 to be inspected is defined as the external reflected light L1 and detected by the second light receiver 130. When the target 2 to be inspected does not exist within the second detection region D2, the second light receiver 130 cannot detect the external reflected light L1. Therefore, far proximity sensing can be performed on the target 2 to be inspected according to whether the second light receiver 130 detects the external reflected light L1.

However, far proximity sensing must entail detecting the weak external reflected light L1 from the distantly-located target 2 to be inspected. Therefore, it is important for the second light receiver 130 to eliminate the crosstalk (e.g. decrease to 0) which might otherwise contribute to noise, thereby detecting only the external reflected light L1 in the absence of the affect from the crosstalk.

Furthermore, the aforesaid crosstalk caused by the internal leaked light L3 can be substantially eliminated with utilizing the VCSEL, by adjusting the distance between light reception and light emission, and/or incorporating with light shielding walls.

Furthermore, the crosstalk caused by the internal reflected light L2 can be substantially eliminated (decreased to approximately 0) with light shielding walls or by adjusting the distance d12 between the second light receiver 130 and the transmissive window 210.

Regarding the proximity sensor 100 in this embodiment, a portion (i.e., a portion of the wall formed for enclosing chip mounted zone 3) of the structural member 140 functions as a first light shielding wall 141 for blocking the internal reflected light L2 and/or the internal leaked light L3 propagating toward the second light receiver 130.

Furthermore, the proximity sensor 100 in this embodiment includes an aforesaid multi-segment structure (vertically stacked structure) as the distance d11 between the first light receiver 120 and the transmissive window 210 can be configured to be different from the distance d12 between the second light receiver 130 and the transmissive window 210. Therefore, the crosstalk characteristic of the first light receiver 120 for use in near proximity sensing and the crosstalk characteristic of the second light receiver 130 for use in far proximity sensing can be respectively optimized.

Furthermore, to perform the far proximity sensing, the proximity sensor preferably detects whether the target 2 to be inspected exists within the second detection region D2 by time-of-flight (TOF) method. The TOF method entails measuring the time from emission of light from the light emitter 110 to detection of the external reflected light L1 by the second light receiver 130 and thereby calculating the distance to the target 2 to be inspected. If the TOF method is adopted, the output result of the AD converter will not depend on the reflectance of the target 2 to be inspected. Therefore, the precision of far proximity sensing is enhanced.

Supplement

A supplement to the description of FIG. 1~FIG. 3 is provided below. Preferably, the first light shielding wall 141 is disposed at a position above the upper surface of the first light receiver 120.

Furthermore, preferably, the second light receiver 130 is disposed at a position below the lower surface of the first light receiver 120.

Furthermore, preferably, the second light receiver 130 is disposed at a position below the lower surface of the first light shielding wall 141 (equivalent to the lower surface of the structural member 140).

Furthermore, preferably, the lower surface of the first light shielding wall 141 (i.e., the lower surface of the structural member 140) is in contact with the upper surface of the chip 153 which the second light receiver 130 is disposed thereon.

Furthermore, preferably, as shown in a cross-sectional view of the proximity sensor 100, the chip 152 which the first light receiver 120 is disposed on, the structural member 140 which the first light shielding wall 141 is disposed on, and the chip 153 which the second light receiver 130 is disposed on overlaps in a vertical direction.

Furthermore, preferably, as shown in a cross-sectional view of the proximity sensor 100, the chip 151 which the light emitter 110 is disposed thereon, the structural member 140 which the first light shielding wall 141 is disposed on, and the chip 153 which the second light receiver 130 is disposed on overlaps in a vertical direction.

Furthermore, regarding the proximity sensor 100, preferably, the distance between the light emitter 110 and a side of the first light receiver 120 facing the light emitter 110 (i.e., right side, as shown in the diagram) is denoted as d1, and the distance between the light emitter 110 and the light emitter-facing side (i.e., right side, as shown in the diagram) of the second light receiver 130 is denoted as d2, where a ratio d2/d1 is greater than 3, for the reason as follows: the first light receiver 120 corresponds to 1 cm proximity, and the second light receiver 130 corresponds to 3 cm proximity, where the ratio d2/d1 equals at least 3.

Furthermore, regarding the proximity sensor 100, preferably, the distance between the light emitter 110 and a side of the first light receiver 120 opposite to the light emitter 110 (i.e., left side, as shown in the diagram) is denoted as d1', and the distance between the light emitter 110 and a side of the second light receiver 130 opposite to the light emitter 110 (i.e., left side, as shown in the diagram) is denoted as d2', where a ratio d2'/d1' is less than 12, for the reason as follows: the first light receiver 120 corresponds to 5 cm proximity, and the second light receiver 130 corresponds to 60 cm proximity, where the ratio d2'/d1' equals 12 or less.

Operation Sequence

Figure 4:
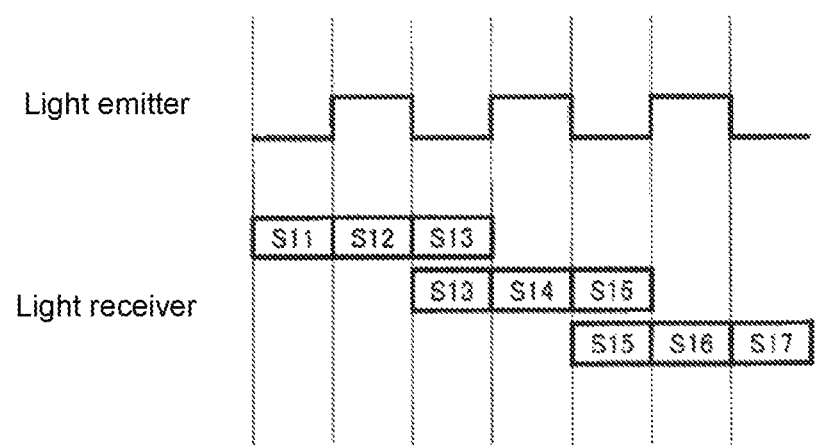
FIG. 4 is a diagram of the sequence of respective operations of a light emitter and a light receiver.

FIG. 4 is a diagram of the sequence of respective operations of a light emitter 110, a first light receiver 120 and a second light receiver 130. As shown in FIG. 4, the light emitter 110 is driven to emit infrared regularly, that is, at a fixed time interval. The first light receiver 120 and second light receiver 130 respectively function to detect incoming light before and after the emission of infrared from the light emitter 110. Each set of instance of implemented measurement entails detecting an ambient light (such as sunlight or indoor light)→detecting external reflected light further detecting ambient light.

Next, the detected level of ambient light (for example, the average detected level of ambient light detected before and after the detection of external reflected light) is subtracted from the detected level of external reflected light, thereby removing the infrared portion (noise portion) from the ambient light.

As shown in the diagram, during the first instance of measurement, the detected level of external reflected light is denoted as S12, and the detected levels of ambient light before and after the first instance of measurement are denoted as S11 and S13, respectively; hence, if the final detected level is denoted as S, it can be calculated with the mathematical expression $S=S12-(S11+S13)/2$. During the second instance of measurement and subsequent instances of measurement, the final detected level S is also calculated with the aforesaid mathematical calculation.

The intensity of the external reflected light returning from the target 2 to be inspected and approaching the proximal sensor 100 decreases with the distance between the target 2 to be inspected and the proximal sensor 100. Comparing to the near proximity sensing performed with the first light receiver 120, the far proximity sensing performed with the second light receiver 130 requires the assumption that the external reflected light is considerably weak ($1/100$ approximately).

Therefore, the output accumulation time (i.e., duration of reception of external reflected light) of the second light receiver 130 is configured to be greater than the output accumulation time of the first light receiver 120. Hence, even though the external reflected light is weak, the precision of the far proximity sensing remains unabated.

However, if the output accumulation time of the second light receiver 130 is configured to be overly long, the removal of infrared portion from the ambient light will be hindered. To avoid this, for example, it is feasible to configure, in advance, the number of times of output accumulation of the second light receiver 130 to be greater than the number of times of output accumulation of the first light receiver 120 rather than extend the output accumulation time of the second light receiver 130 infinitely. As shown in the diagram, for example, the detected levels (S12, S14, S16) of the external reflected light in three instances measurement are added up to obtain the sum of the detected level in one instance of measurement.

Second Embodiment

Figure 5:
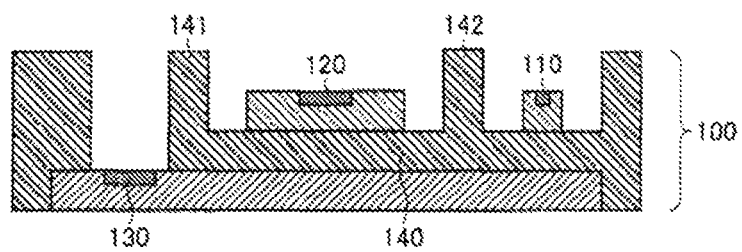
FIG. 5 is a diagram of the proximity sensor according to the second embodiment of the present disclosure.

FIG. 5 is a diagram of the proximity sensor 100 according to the second embodiment of the present disclosure. As shown in FIG. 5, compared with the first embodiment (FIG. 1), the second embodiment has a different technical feature: a second light shielding wall 142 is further disposed between the light emitter 110 and the first light receiver 120 and adapted to reduce the internal reflected light and internal leaked light toward the first light receiver 120.

Third Embodiment

Figure 6:
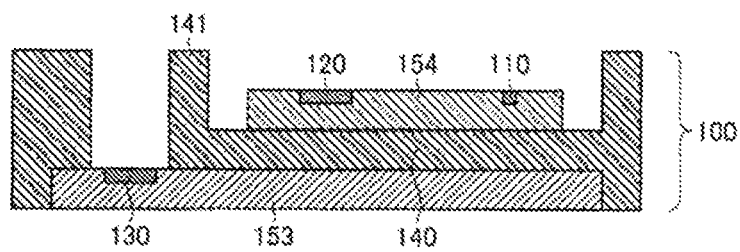
FIG. 6 is a diagram of the proximity sensor according to the third embodiment of the present disclosure.

FIG. 6 is a diagram of the proximity sensor 100 according to the third embodiment of the present disclosure. Compared with the first embodiment (FIG. 1) and the second embodiment (FIG. 5), the third embodiment has a different technical feature: the light emitter 110 and first light receiver 120 are formed on the same chip 154. Therefore, module simplification and cost reduction can be attained. Furthermore, given the component structure, both near proximity sensing and far proximity sensing can be performed.

Fourth Embodiment

Figure 7:
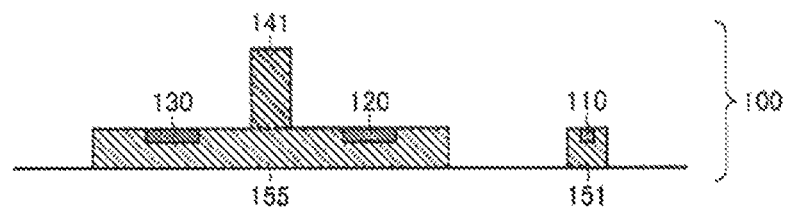
FIG. 7 is a diagram of the proximity sensor according to the fourth embodiment of the present disclosure.

FIG. 7 is a diagram of the proximity sensor 100 according to the fourth embodiment of the present disclosure. The proximity sensor 100 in the fourth embodiment is different from any one of the proximity sensors in the first embodiment (FIG. 1), the second embodiment (FIG. 5), and the third embodiment (FIG. 6) by technical features as follows: the light emitter 110 and the first light receiver 120 are formed on the same chip 155, wherein the aforesaid multi-segment structure (vertically stacked structure) is not utilized herein. In the situation where such device structure is used, crosstalk characteristics of the light receivers are thereby optimized to attain both near proximity sensing and far proximity sensing when the first light shielding wall 141 is disposed between the first light receiver 120 and second light receiver 130 or when the distance between the second light receiver 130 and the light emitter 110 is greater than the distance between the first light receiver 120 and the light emitter 110.

Fifth Embodiment

Figure 8:
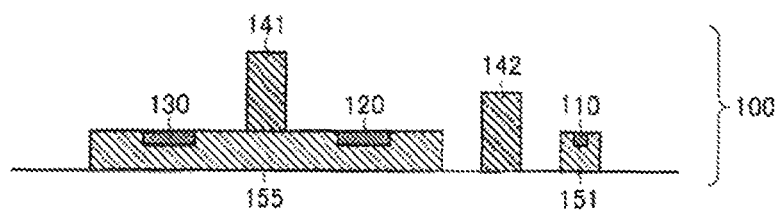
FIG. 8 is a diagram of the proximity sensor according to the fifth embodiment of the present disclosure.

FIG. 8 is a diagram of the proximity sensor 100 according to the fifth embodiment of the present disclosure. As shown in FIG. 8, compared with the fourth embodiment (FIG. 7), the fifth embodiment has a different technical feature: the second light shielding wall 142 is further disposed between the light emitter 110 and the first light receiver 120.

Sixth Embodiment

Figure 9:
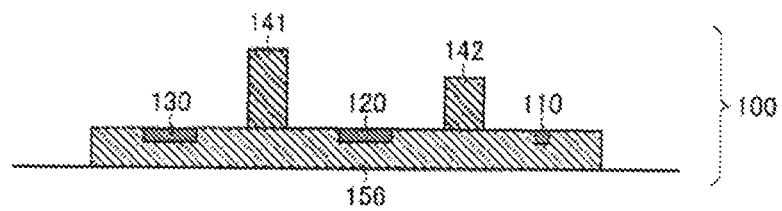
FIG. 9 is a diagram of the proximity sensor according to the sixth embodiment of the present disclosure.

FIG. 9 is a diagram of the proximity sensor 100 according to the sixth embodiment of the present disclosure. Compared with any one of the first embodiment (FIG. 1), second embodiment (FIG. 5), third embodiment (FIG. 6), fourth embodiment (FIG. 7), and fifth embodiment (FIG. 8), the sixth embodiment has a different technical feature: the light emitter 110, first light receiver 120, and second light receiver 130 are formed on the same chip 156. Therefore, the incorporating the proximity sensor 100 on one single chip can be achieved. Therefore, the module is further simplified or effective in cost cutting. Furthermore, in the situation where such device structure is used, crosstalk characteristics of the light receivers are optimized to thereby attain both near proximity sensing and far proximity sensing, by providing the first light shielding wall 141 and the second light shielding wall 142, or adjusting their height (for example, adjusting the height of the first light shielding wall 141 such that the first light shielding wall 141 becomes higher than the second light shielding wall 142), or adjusting the distance between the second light receiver 130 and the light emitter 110 to be greater than the distance between the first light receiver 120 and the light emitter 110.

Application in Smartphone

Figure 10:
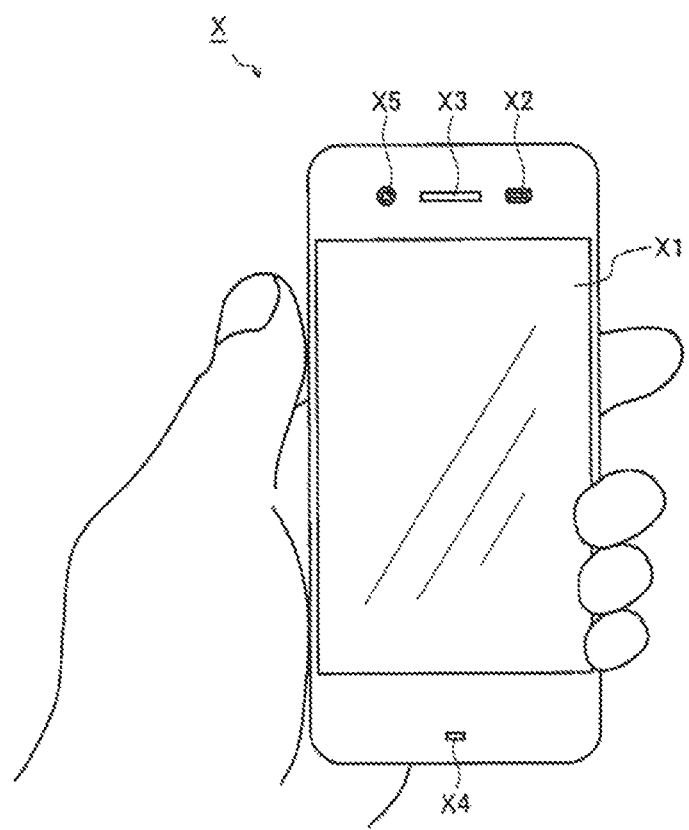
FIG. 10 is a perspective view of a smartphone.

FIG. 10 is a perspective view of a smartphone X. The smartphone X is an illustrative example for the electronic device 1 and includes display screen X1 (liquid crystal display or organic electro-luminescence (EL) display) capable of functioning as a touch panel, optical proximity sensor X2, speaker X3, microphone X4, and camera X5.

To conduct a conversation with the smartphone X, a user puts one of user's two ears and user's mouth close to speaker X3 and microphone X4, respectively. Meanwhile, one of the user's two cheeks is close to display screen X1. If proximity sensor X2 detects the short-distance approach (for example, 0~5 cm approximately), the touch panel function of display screen X1 is disabled, so as to prevent an inadvertent touch during the conversation. Furthermore, if display screen X1 is turned off in advance during the conversation, the power consumption of the smartphone X can also be reduced.

Furthermore, to undergo facial authentication with the smartphone X, the user makes his or her face approach camera X5 until the distance is proper for taking pictures. When proximity sensor X2 detects the medium- and long-distance (for example, 3~60 cm approximately, i.e., far), the facial authentication module will be activated, thereby reducing the power consumption of the smartphone X.

Furthermore, proximity sensor X2 is preferably the aforesaid proximity sensor 100.

Other Variant Embodiment

Furthermore, various changes can be made to the above technical features without departing from the scope of the present disclosure. The above embodiments are illustrative rather than restrictive of the present disclosure in all aspects. The scope of the present disclosure is not restricted to the embodiments but encompasses all changes equivalent to the disclosure contained in the claims in terms of interpretation and scope.

INDUSTRIAL APPLICABILITY

The present disclosure provides a proximity sensor which can be specifically suitable for being incorporated into, for example, a smartphone.

What is claimed is:

1. A proximity sensor, comprising:
a light emitter configured to irradiate light to a target to be inspected;
a first light receiver having a first crosstalk characteristic, configured to detect an external reflected light from a target to be inspected within a first detection region;
a second light receiver having a second crosstalk characteristic different from the first crosstalk characteristic, configured to detect an external reflected light from a target to be inspected within a second detection region relatively further than the first detection region;
a structural member including a first light shielding wall, a second light shielding wall and a horizontal portion, wherein
the first light shielding wall, the second light shielding wall and the horizontal portion are integrally formed with one another,
the first light shielding wall extends vertically from the horizontal portion and is configured to shield an internal reflected light and an internal leaked light toward the second light receiver,
the second light shielding wall extends vertically from the horizontal portion and is configured to reduce an internal reflected light and an internal leaked light toward the first light receiver,
the horizontal portion is between a first chip on which the first light receiver is disposed and a second chip on which the second light receiver is disposed, and is between the second chip and a third chip on which the light emitter is disposed,
the first light shielding wall is disposed between the first light receiver and the second light receiver, the second light shielding wall is disposed between the light emitter and the first light receiver, the first light shielding wall, the second light shielding wall and the horizontal portion collectively surround the first chip, the first, second and third chips contact the horizontal portion, the first light receiver is surrounded by the first chip, and the light emitter is surrounded by the third chip isolated from the first chip by the second light shielding wall.

2. The proximity sensor of claim 1, wherein a distance between the second light receiver and a transmissive window is greater than a distance between the first light receiver and the transmissive window.

3. The proximity sensor of claim 1, wherein a distance between the second light receiver and the light emitter is greater than a distance between the first light receiver and the light emitter.

4. The proximity sensor of claim 1, wherein the light emitter is a vertical cavity surface emitting LASER (VCSEL).

5. The proximity sensor of claim 1, wherein an output accumulation time of the second light receiver is longer than an output accumulation time of the first light receiver.

6. The proximity sensor of claim 1, wherein a number of times of output accumulation of the second light receiver is greater than a number of times of output accumulation of the first light receiver.

7. The proximity sensor of claim 1, wherein the proximity sensor detects whether a target to be inspected exists within the second detection region by time-of-flight (TOF) method.

8. The proximity sensor of claim 1, wherein the light emitter, the first light receiver, and the second light receiver are respectively formed on different chips individually.

9. The proximity sensor of claim 1, wherein the first detection region is in a range from 0 cm to 5 cm and the second detection region is in a range from 3 cm to 60 cm.

10. The proximity sensor of claim 1, wherein the first light shielding wall extends to a position above an upper surface of the first light receiver.

11. The proximity sensor of claim 1, wherein the second light receiver is disposed at a position below a lower surface of the first light receiver.

12. The proximity sensor of claim 1, wherein the second light receiver is disposed at a position below a lower surface of the first light shielding wall.

13. The proximity sensor of claim 12, wherein the lower surface of the first light shielding wall is in contact with an upper surface of the second chip with the second light receiver disposed thereon.

14. The proximity sensor of claim 13, wherein the first chip with the first light receiver disposed thereon, the structural member with the first light shielding wall formed thereon, and the second chip with the second light receiver disposed thereon vertically overlaps in a cross-sectional view.

15. The proximity sensor of claim 13, wherein the third chip with the light emitter formed thereon, the structural member with the first light shielding wall formed thereon, and the second chip with the second light receiver disposed thereon vertically overlaps in a cross-sectional view.

16. The proximity sensor of claim 1, wherein a distance d1 is between the light emitter and an edge of the first light receiver on a side proximal to the light emitter, a distance d2 is between the light emitter and an edge of the second light receiver on a side proximal to the light emitter, wherein a ratio d2/d1 is greater than 3.

17. The proximity sensor of claim 1, wherein a distance d1' is between the light emitter and an edge of the first light receiver on a side opposite to the light emitter, a distance d2' is between the light emitter and an edge of the second light receiver on a side opposite to the light emitter, wherein a ratio d2'/d1' is less than 12.

18. An electronic device, comprising:

the proximity sensor of claim 1; and a casing comprising a transmissive window facing the proximity sensor.

* * * * *